US010312402B2

(12) United States Patent
Machii et al.

(10) Patent No.: US 10,312,402 B2
(45) Date of Patent: Jun. 4, 2019

(54) P-TYPE DIFFUSION LAYER FORMING COMPOSITION

(71) Applicant: HITACHI CHEMICAL COMPANY, LTD., Chiyoda-ku, Tokyo (JP)

(72) Inventors: Youichi Machii, Tsukuba (JP); Masato Yoshida, Tsukuba (JP); Takeshi Nojiri, Tsukuba (JP); Kaoru Okaniwa, Tsukuba (JP); Mitsunori Iwamuro, Tsukuba (JP); Shuichiro Adachi, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/262,719

(22) Filed: Apr. 26, 2014

(65) Prior Publication Data
US 2014/0227821 A1    Aug. 14, 2014

Related U.S. Application Data

(62) Division of application No. 13/013,376, filed on Jan. 25, 2011.

(60) Provisional application No. 61/301,652, filed on Feb. 5, 2010.

(30) Foreign Application Priority Data
Jan. 13, 2011 (JP) ................. 2011-005312

(51) Int. Cl.
H01L 31/18 (2006.01)
H01L 31/0224 (2006.01)
H01L 21/22 (2006.01)
H01L 21/225 (2006.01)

(52) U.S. Cl.
CPC ...... *H01L 31/1864* (2013.01); *H01L 21/2225* (2013.01); *H01L 21/2255* (2013.01); *H01L 31/022425* (2013.01); *H01L 31/1804* (2013.01); *Y02E 10/547* (2013.01); *Y02P 70/521* (2015.11)

(58) Field of Classification Search
USPC ....................................... 438/543
See application file for complete search history.

(56) References Cited

U.S. PATENT DOCUMENTS

| 1,304,623 | A | 5/1919 | Sullivan et al. |
| 2,794,846 | A | 6/1957 | Fuller et al. |
| 4,490,192 | A | 12/1984 | Gupta et al. |
| 4,588,455 | A | 5/1986 | Genser |
| 6,365,493 | B1 | 4/2002 | Vekris et al. |
| 6,384,317 | B1 | 5/2002 | Kerschaver et al. |
| 6,426,280 | B2 | 7/2002 | Vekris et al. |
| 6,695,903 | B1 | 2/2004 | Kübelbeck et al. |
| 7,824,579 | B2 | 11/2010 | Young et al. |
| 8,404,604 | B2 | 3/2013 | Hidaka et al. |
| 2004/0003836 | A1 | 1/2004 | Watsuji et al. |
| 2005/0012095 | A1 | 1/2005 | Niira et al. |
| 2005/0160970 | A1 | 7/2005 | Niira et al. |
| 2006/0231801 | A1 | 10/2006 | Carroll et al. |
| 2006/0272700 | A1 | 12/2006 | Young et al. |
| 2007/0194710 | A1 | 8/2007 | Song et al. |
| 2007/0295939 | A1 | 12/2007 | Ollvier et al. |
| 2008/0280119 | A1 | 11/2008 | Kishimoto et al. |
| 2009/0092745 | A1 | 4/2009 | Pavani et al. |
| 2009/0120490 | A1 | 5/2009 | Huang et al. |
| 2009/0139590 | A1 | 6/2009 | Marques |
| 2009/0298283 | A1 | 12/2009 | Akimoto |
| 2009/0301553 | A1 | 12/2009 | Konno et al. |
| 2009/0301554 | A1 | 12/2009 | Konno et al. |
| 2010/0009203 | A1 | 1/2010 | Nageno et al. |
| 2010/0108129 | A1 | 5/2010 | Ahn et al. |
| 2010/0136314 | A1 | 6/2010 | Umayahara et al. |
| 2010/0155117 | A1 | 6/2010 | Inaba et al. |
| 2010/0173446 | A1 | 7/2010 | Khadilkar et al. |
| 2010/0175744 | A1* | 7/2010 | Hirai ............... H01L 21/228 136/252 |
| 2010/0270919 | A1 | 10/2010 | Hubert et al. |
| 2011/0135857 | A1 | 6/2011 | Logunov et al. |
| 2011/0147678 | A1* | 6/2011 | Kim ............... H01B 1/22 252/519.3 |
| 2012/0040490 | A1 | 2/2012 | Gallazzo et al. |
| 2014/0141258 | A1 | 5/2014 | Umayahara et al. |

FOREIGN PATENT DOCUMENTS

| CN | 101636819 A | 1/2010 |
| CN | 101636819 A | 1/2010 |
| EP | 0 130 311 A2 | 1/1985 |
| JP | 2-162720 A | 6/1990 |
| JP | 2000-138386 A | 5/2000 |
| JP | 2002-075894 A | 3/2002 |

(Continued)

OTHER PUBLICATIONS

Office Action dated May 15, 2014, in Taiwanese Patent Application No. 100102723.
Office Action dated May 5, 2014, in Chinese Patent Application No. 201110031097.9.
Office Action dated Aug. 11, 2014, in Taiwanese Patent Application No. 10321092880.

(Continued)

*Primary Examiner* — Asok K Sarkar
(74) *Attorney, Agent, or Firm* — Seyfarth Shaw LLP

(57) ABSTRACT

The composition for forming a p-type diffusion layer in accordance with the present invention contains an acceptor element-containing glass powder and a dispersion medium. A p-type diffusion layer and a photovoltaic cell having a p-type diffusion layer are prepared by applying the composition for forming a p-type diffusion layer, followed by a thermal diffusion treatment.

12 Claims, No Drawings

(56) References Cited

FOREIGN PATENT DOCUMENTS

| | | |
|---|---|---|
| JP | 2002-539615 A | 11/2002 |
| JP | 2003-069056 A | 3/2003 |
| JP | 2003-223813 A | 8/2003 |
| JP | 2005-005436 A | 1/2005 |
| JP | 4073968 B2 | 2/2008 |
| JP | 2009-177129 A | 8/2009 |
| JP | 2009-530845 A | 8/2009 |
| JP | 2009-200276 A | 9/2009 |
| KR | 10-2005-0045047 | 5/2005 |
| KR | 10-2008-0057230 | 6/2008 |
| KR | 10-2008005723 | 6/2008 |
| SU | 430080 A | 10/1974 |
| TW | 492081 B | 6/2002 |
| TW | 492081 B | 6/2002 |
| WO | WO 2009/009512 A1 | 1/2009 |
| WO | WO 2009/029738 A1 | 3/2009 |
| WO | WO 2009/045707 A1 | 4/2009 |
| WO | WO 2009/060761 A1 | 5/2009 |
| WO | WO 2009/099230 A1 | 8/2009 |

OTHER PUBLICATIONS

Final Office Action dated Sep. 22, 2014, in U.S. Appl. No. 13/013,595.
Office Action dated Mar. 5, 2014, in Chinese Patent Application No. 201110030986.3.
Non-Final Office Action dated May 7, 2014, in U.S. Appl. No. 13/013,455.
Non-Final Office Action dated May 7, 2014, in U.S. Appl. No. 14/071,720.
Non-Final Office Action dated May 30, 2014, in U.S. Appl. No. 13/427,891.
Kim, D., et al., "Effect of the Thermal Properties of Frits on the Electrical Properties of Screen-Printed Silicon Solar Cells", Journal of the Korean Physical Society, vol. 55, No. 3, Sep. 1, 2009, pp. 1046-1050.
Office Action dated Nov. 12, 2014, in European Patent Application No. 13 178 174.2.
Final Office Action dated Oct. 30, 2014, in U.S. Appl. No. 13/013,376.
Handbook of Chemistry and Physics, 92nd Edition, 2011-2012, pp. 2-59, 2-64.
M. Brain, "How Semiconductors Work," HowStuffWorks.com. <http://www.howstuffworks.com/diode.htm> May 2001.
Salami et al., "Characterization of Screen Printed Phosphorous Diffusion Paste for Silicon Solar Cells," Technical Digest of the International PVSEC-14, Bangkok, Thailand, 2004: pp. 263-264.
Office Action dated Aug. 7, 2012, in Japanese Patent Application No. 2011-005312.
Office Action dated Oct. 16, 2012, in Japanese Patent Application No. 2011-005312.
Office Action (Notice of Reasons for Rejection) dated Oct. 16, 2012, in Japanese Patent Application No. 2011-247602 (with English translation).
Office Action dated Jul. 9, 2013, in Japanese Patent Application No. 2011-005312.
Extended European Search Report dated Oct. 11, 2013, in European Patent Application No. 13178174.2.
U.S. Appl. No. 13/013,376, filed Jan. 25, 2011.
U.S. Appl. No. 13/013,455, filed Jan. 25, 2011.
U.S. Appl. No. 13/013,532, filed Jan. 25, 2011.
U.S. Appl. No. 13/013,595, filed Jan. 25, 2011.
U.S. Appl. No. 13/427,878, filed Mar. 22, 2012.
U.S. Appl. No. 13/427,891, filed Mar. 23, 2012.
U.S. Appl. No. 14/071,720, filed Nov. 5, 2013.
Non-Final Office Action dated Nov. 13, 2012, in U.S. Appl. No. 13/013,595.
Non-Final Office Action dated Nov. 21, 2012, in U.S. Appl. No. 13/013,455.
Final Office Action dated Nov. 29, 2012, in U.S. Appl. No. 13/427,878.
Final Office Action dated Nov. 29, 2012, in U.S. Appl. No. 13/427,891.
Non-Final Office Action dated Feb. 20, 2013, in U.S. Appl. No. 13/013,376.
Final Office Action dated Apr. 24, 2013, in U.S. Appl. No. 13/013,532.
Non-Final Office Action dated May 9, 2013, in U.S. Appl. No. 13/013,455.
Non-Final Office Action dated Jun. 6, 2013, in U.S. Appl. No. 13/427,891.
Final Office Action dated Jun. 27, 2013, in U.S. Appl. No. 13/013,595.
Final Office Action dated Aug. 6, 2013, in U.S. Appl. No. 13/013,376.
Non-Final Office Action dated Aug. 13, 2013, in U.S. Appl. No. 13/427,878.
Final Office Action dated Oct. 18, 2013, is U.S. Appl. No. 13/013,455.
Final Office Action dated Nov. 26, 2013, in U.S. Appl. No. 13/427,891.
Non-Final Office Action dated Jan. 22, 2014, in U.S. Appl. No. 13/013,595.
Final Office Action dated Mar. 12, 2014, in U.S. Appl. No. 13/427,878.
Non-Final Office Action dated Apr. 4, 2014, in U.S. Appl. No. 13/013,376.
Non-Final Office Action dated Apr. 4, 2014, in U.S. Appl. No. 13/013,532.
Office Action issued in European Patent Application No. 11151993.0 dated Mar. 12, 2015.
Excerpt from WM Haynes, et al.: "CRC Handbook of Chemistry and Physics 95$^{th}$ Edition Internet Version 2015 Editor-in-Chief Editor, Internet Edition Editorial Advisory Board Physical Constants of Inorganic Compounds", Table in Section 4 http://www.hbcpnetbase.com/ Jan. 22, 2015 (Jan. 22, 2015), pp. 1-60, XP055164227.
Office Action issued in Taiwanese Patent Application No. 10420740420 dated Jun. 5, 2015.
"Thermal Properties of Corning Glassess", XP055221383, Retrieved from the Internet: http://www.quartz.com/pxtherm.pdf (retrieved on Oct. 15, 2015).
Office Action issued in corresponding European Patent Application No. 13 178 174.2 dated Oct. 21, 2015.
Non-Final Office Action in related U.S. Appl. No. 13/013,595, dated Apr. 7, 2015.
Final Office Action in related U.S. Appl. No. 13/013,595, dated Sep. 24, 2015.
"Properties of PYREX®, PYREXPLUS®, and Low Actinic PYREX Code 7740 Glasses", p. 2 properties of Code 7740 Glass.
Notification of Provisional Rejection issued in Korean Patent Application No. 2011-0007215 dated Jun. 20, 2016.
Final Office Action in U.S. Appl. No. 13/013,376, dated May 5, 2016.
Non-Final Office Action in U.S. Appl. No. 13/013,595, dated May 5, 2016.
Non-Final Office Action in co-pending U.S. Appl. No. 13/013,376, dated Aug. 14, 2015.

* cited by examiner

P-TYPE DIFFUSION LAYER FORMING COMPOSITION

BACKGROUND OF THE INVENTION

Field of the Invention

The present invention relates to a composition for forming a p-type diffusion layer of a photovoltaic cell, a method for forming a p-type diffusion layer, a method for producing a photovoltaic cell, a paste composition, and a use of the composition. More specifically, the present invention relates to a technique for forming a p-type diffusion layer, which enables reduction in internal stress of silicon substrate serving as a semiconductor substrate, whereby damage to a crystal grain boundary can be suppressed and increase in crystal defects and warpage can be suppressed.

Description of the Related Art

A related art procedure of a silicon photovoltaic cell is described hereinbelow.

First, in order to realize high efficiency by promoting optical confinement effects, a p-type silicon substrate having a texture structure formed thereon is prepared, and subsequently subjected to a treatment at a temperature of from 800 to 900° C. for several tens of minutes under a mixed gas atmosphere of phosphorus oxychloride ($POCl_3$), nitrogen and oxygen, thereby uniformly forming an n-type diffusion layer. According to this related art method, since diffusion of phosphorus is carried out using a mixed gas, the n-type diffusion layer is formed not only on the surface, but also on the side face and the rear surface. For these reasons, there has been a need for a side etching process to remove the n-type diffusion layer of the side face. Further, the n-type diffusion layer of the rear surface needs to be converted into a $p^+$-type diffusion layer, and correspondingly an aluminum paste is applied to the n-type diffusion layer of the rear surface and then sintered to achieve conversion of the n-type diffusion layer into the $p^+$-type diffusion layer and also formation of ohmic contact at the same time.

However, aluminum paste has low conductivity, and therefore, it is generally necessary to form a thick aluminum layer of about 10 to 20 µm after sintering on the entire rear surface in order to reduce the sheet resistance. Further, the coefficient of thermal expansion of aluminum is considerably different from the coefficient of thermal expansion of silicon, and therefore, such a difference results in generation of large internal stress in the silicon substrate during the sintering and cooling processes, which contributes to damage to a crystal grain boundary, increase in the crystal defects, and the warpage.

In order to solve this problem, there has been a method to reduce the thickness of the rear surface electrode by decreasing the amount of a paste composition to be coated. However, when the coating amount of the paste composition is decreased, the amount of aluminum diffused from a surface of a p-type silicon substrate into an internal portion is insufficient. As a result, a desirable BSF (Back Surface Field) effect (an effect in which collection efficiency of generated carriers is increased due to the presence of a $p^+$-type layer) is not achieved, resulting in the problem of a decrease in properties of a photovoltaic cell.

For these reasons, for example, there has been proposed a paste composition including an aluminum powder, an organic vehicle, and an inorganic compound powder whose coefficient of the thermal expansion is lower than that of aluminum, and whose at least one of melting temperature, softening temperature and decomposition temperature is lower than the melting temperature of aluminum (for example, Japanese Patent Application Laid-Open (JP-A) No. 2003-223813)

SUMMARY OF THE INVENTION

A first embodiment according to the present invention is a composition for forming a p-type diffusion layer, including an acceptor element-containing glass powder and a dispersion medium.

A second embodiment of the present invention is a method for forming a p-type diffusion layer, including:
applying, on a semiconductor substrate, the composition for forming a p-type diffusion layer of the first embodiment; and conducting a thermal diffusion treatment.

A third embodiment of the present invention is a method for producing a photovoltaic cell, including:
applying, on a semiconductor substrate, the composition for forming a p-type diffusion layer of any one of the first embodiment;
subjecting the substrate to a thermal diffusion treatment to form an p-type diffusion layer; and
forming an electrode on the p-type diffusion layer.

A fourth embodiment of the present invention is a paste composition for forming an p-type diffusion region in a semiconductor substrate, comprising a dispersion of acceptor element-containing glass particles in a spreadable paste medium.

A fifth embodiment of the present invention is a method for forming an p-type diffusion region in a semiconductor, comprising the steps of:
1) coating a portion of a semiconductor substrate with a layer of a composition comprising a dispersion of acceptor element-containing glass particles in a dispersion medium; and
2) heating the coated semiconductor substrate to a temperature sufficient to cause acceptor element diffusion from the glass into the semiconductor substrate so as to form an p-type diffusion region in the semiconductor substrate.

A sixth embodiment of the present invention is a use of an acceptor element-containing glass powder for forming a p-type diffusion layer on a semiconductor substrate.

The present invention enables the formation of a p-type diffusion layer without causing internal stress in a silicon substrate and warpage of the substrate during the process of producing a photovoltaic cell using a silicon substrate.

DETAILED DESCRIPTION OF THE INVENTION

The invention includes the following embodiments.

<1> A composition for forming a p-type diffusion layer, comprising an acceptor element-containing glass powder and a dispersion medium.

<2> The composition for forming a p-type diffusion layer according to <1>, in which the acceptor element is at least one selected from boron (B), aluminum (Al) and gallium (Ga).

<3> The composition for forming a p-type diffusion layer according to <1>, in which the acceptor element-containing glass powder contains:
at least one acceptor element-containing material selected from $B_2O_3$, $Al_2O_3$ and $Ga_2O_3$; and
at least one glass component material selected from $SiO_2$, $K_2O$, $Na_2O$, $Li_2O$, $BaO$, $SrO$, $CaO$, $MgO$, $BeO$, $ZnO$, $PbO$, $CdO$, $V_2O_5$, $SnO$, $ZrO_2$ and $MoO_3$.

<4> A method for forming a p-type diffusion layer, including:
applying, on a semiconductor substrate, the composition for forming a p-type diffusion layer of <1>; and
conducting a thermal diffusion treatment.

<5> A paste composition for forming a p-type diffusion region in a semiconductor substrate, comprising a dispersion of acceptor element-containing glass particles in a spreadable paste medium.

<6> A method for producing a photovoltaic cell, including:
applying, on a semiconductor substrate, the composition for forming a p-type diffusion layer of <1>;
subjecting the substrate to a thermal diffusion treatment to form a p-type diffusion layer; and
forming an electrode on the p-type diffusion layer.

<7> The method for producing a photovoltaic cell according to <6>, comprising the steps of applying the composition for forming an p-type diffusion layer to the silicon substrate, optionally through an n-type diffusion layer, and heat treatment to form a glass layer and an $p^+$-type diffusion layer beneath the glass layer.

<8> The method for producing a photovoltaic cell according to <6>, comprising the following steps:
removing the damaged surface layer from a crystalline silicon substrate;
(ii) etching the crystalline silicon substrate to form a textured front surface structure;
(iii) forming an n-type diffusion layer around the silicon substrate in a mixed gas atmosphere of phosphorus oxychloride, nitrogen and oxygen, and removing the n-type diffusion layer from the side faces by side etching;
(iv) applying the composition for forming an p-type diffusion layer to the n-type diffusion layer on the rear surface of the silicon substrate, and after optional drying to remove solvent present in the composition, heat treatment, preferably at a temperature of 600 to 1200° C., to form a glass layer and an $p^+$-type diffusion layer beneath the glass layer;
(v) removing the glass layer by etching;
(vi) forming an antireflective film over the n-type diffusion layer on the front surface;
(vii) forming surface electrode on the antireflective film;
(viii) forming rear surface electrode on the $p^+$-type diffusion layer; and
(ix) sintering to establish electrical connection between the surface electrode and the silicon substrate.

<9> The method for producing a photovoltaic cell according to <6> comprising the following steps:
(i) removing the damaged surface layer from a crystalline silicon substrate;
(ii) etching the crystalline silicon substrate to form a textured surface structure;
(iii) applying a composition comprising a donor-element containing glass powder and a dispersion medium on the textured front surface;
(iv) applying the composition for forming an p-type diffusion layer to the rear surface of the silicon substrate;
(v) optional drying to remove solvent present in the compositions applied to the surfaces of the silicon substrate;
(vi) heat treatment, preferably at a temperature of 600 to 1200° C., to form a glass layer and an n-type diffusion layer beneath the glass layer on the front surface, and a glass layer and an $p^+$-type diffusion layer beneath the glass layer on the rear surface;
(vii) removing the glass layers by etching;
(viii) forming an antireflective film over the n-type diffusion layer on the front surface;
(ix) forming surface electrode on the antireflective film;
(x) forming rear surface electrode on the $p^+$-type diffusion layer on the rear surface; and
(xi) sintering to establish electrical connection between the surface electrode and the silicon substrate.

<10> A method for forming a p-type diffusion region in a semiconductor, comprising the steps of:
1) coating a portion of a semiconductor substrate with a layer of a composition comprising a dispersion of acceptor element-containing glass particles in a dispersion medium; and
2) heating the coated semiconductor substrate to a temperature sufficient to cause acceptor element diffusion from the glass into the semiconductor substrate so as to form an p-type diffusion region in the semiconductor substrate.

<11> A use of an acceptor element-containing glass powder for forming a p-type diffusion layer on a semiconductor substrate.

<12> The use according to <11>, in which the acceptor element is at least one selected from boron (B), aluminum (Al) and gallium (Ga).

<13> The use according to <11>, in which the acceptor element-containing glass powder contains:
at least one acceptor element-containing material selected from $B_2O_3$, $Al_2O_3$ and $Ga_2O_3$; and
at least one glass component material selected from $SiO_2$, $K_2O$, $Na_2O$, $Li_2O$, $BaO$, $SrO$, $CaO$, $MgO$, $BeO$, $ZnO$, $PbO$, $CdO$, $V_2O_5$, $SnO$, $ZrO_2$ and $MoO_3$.

<14> The use according to <11>, in which the acceptor element-containing glass powder is used in the form of a composition, which further comprises a dispersion medium.

<15> The use according to <14>, in which the dispersion medium comprises a binder and a solvent.

<16> The use according to <15>, in which the binder is a cellulose derivative, in particular ethylcellulose, and/or the solvent is an ester.

The present invention enables the formation of a p-type diffusion layer without causing an internal stress in a silicon substrate and warpage of the substrate during the process of producing a photovoltaic cell using a silicon substrate.

First, a composition for forming a p-type diffusion layer in accordance with the present invention will be described, and then a method for forming a p-type diffusion layer and a method for producing a photovoltaic cell, using the composition for forming a p-type diffusion layer, will be described.

In the present specification, the term "process" denotes not only independent processes but also processes that cannot be clearly distinguished from other processes as long as a purpose is accomplished by the process.

Furthermore, in the present specification, "from . . . to . . ." denotes a range including each of the minimum value and the maximum value of the values described in this expression.

The composition for forming a p-type diffusion layer in accordance with the present invention includes at least an acceptor element-containing glass powder (hereinafter, often referred to simply as "glass powder") and a dispersion medium, and may further contain other additives as necessary, taking into consideration coatability or the like.

As used herein, the term "composition for forming a p-type diffusion layer" refers to a material which contains an acceptor element-containing glass powder and is capable of forming a p-type diffusion layer through thermal diffusion of the acceptor element after application of the material to a silicon substrate. The use of the composition including the acceptor element-containing glass powder for forming a p-type diffusion layer, in which the acceptor element is included in the glass powder, ensures that a process of forming a p$^+$-type diffusion layer and a process of forming ohmic contact are separated, whereby the options for the electrode material for forming ohmic contact are expanded, and the options for the structure of the electrode are also expanded. For example, when a low resistance material like Ag is applied to an electrode, an electrode having a thin film thickness and low resistance can be achieved. Further, there is no need to form an electrode on the whole surface, and therefore, the electrode may be partially formed such as a comb-shaped electrode. As mentioned above, due to forming a thin or partial electrode such a comb-shaped electrode, it is possible to form a p-type diffusion layer, while suppressing an internal stress in a silicon substrate and warpage of the substrate.

Accordingly, when the composition for forming a p-type diffusion layer in accordance with the present invention is employed, internal stress in a silicon substrate and warpage of the substrate, which occur in the conventionally widely used method, namely a method in which an aluminum paste is applied to the n-type diffusion layer and then sintered to convert the n-type diffusion layer into the p$^+$-type diffusion layer and also to form ohmic contact at the same time, are suppressed.

Furthermore, since the acceptor element included in the glass powder is hardly vaporized during sintering, formation of the p-type diffusion layer in areas other than a desired area due to vaporization of the acceptor element is suppressed.

The acceptor element-containing glass powder in accordance with the present invention will be described in more detail.

As used herein, the term "acceptor element" refers to an element which is capable of forming a p-type diffusion layer by doping thereof on a silicon substrate. As the acceptor element, elements of Group XIII of the periodic table can be used. Examples of the acceptor element include B (boron), aluminum (Al) and gallium (Ga).

Examples of the acceptor element-containing material which is used for introducing the acceptor element into the glass powder include $B_2O_3$, $Al_2O_3$ and $Ga_2O_3$. At least one selected from $B_2O_3$, $Al_2O_3$ and $Ga_2O_3$ is preferably used.

Further, the melting temperature, softening point, glass-transition point, chemical durability and the like of the acceptor element-containing glass powder can be controlled by adjusting the component ratio, if necessary. Further, the glass powder preferably contains the below-mentioned glass component material.

Examples of the glass component material include $SiO_2$, $K_2O$, $Na_2O$, $Li_2O$, $BaO$, $SrO$, $CaO$, $MgO$, $BeO$, $ZnO$, $PbO$, $CdO$, $V_2O_5$, $SnO$, $ZrO_2$, $WO_3$, $MoO_3$, $MnO$, $La_2O_3$, $Nb_2O_5$, $Ta_2O_5$, $Y_2O_3$, $TiO_2$, $GeO_2$, $TeO_2$, and $Lu_2O_3$. At least one selected from $SiO_2$, $K_2O$, $Na_2O$, $Li_2O$, $BaO$, $SrO$, $CaO$, $MgO$, $BeO$, $ZnO$, $PbO$, $CdO$, $V_2O_5$, $SnO$, $ZrO_2$, and $MoO_3$ is preferably used.

Specific examples of the acceptor element-containing glass powder include those including both the acceptor element-containing material and the glass component material such as, for example, $B_2O_3$ based glass which includes $B_2O_3$ as the acceptor element such as $B_2O_3$—$SiO_2$ (the acceptor element-containing material and the glass component material are listed in this order, and are listed in the same order below) based glass, $B_2O_3$—$ZnO$ based glass, $B_2O_3$—$PbO$ based glass, single $B_2O_3$ based glass; $Al_2O_3$ based glass which includes $Al_2O_3$ as the acceptor element such as $Al_2O_3$—$SiO_2$ based glass; and $Ga_2O_3$ based glass which includes $Ga_2O_3$ as the acceptor element such as $Ga_2O_3$—$SiO_2$ based glass.

The acceptor element-containing glass powder may include two or more acceptor element-containing materials such as $Al_2O_3$—$B_2O_3$, $Ga_2O_3$—$B_2O_3$ or the like.

Although composite glasses containing one or two components are illustrated in the above, composite glass containing three or more components, such as $B_2O_3$—$SiO_2$—$Na_2O$, may also be possible.

The content of the glass component material in the glass powder is preferably appropriately set taking into consideration the melting temperature, the softening point, the glass-transition point, and chemical durability. Generally, the content of the glass component material is preferably from 0.1% by mass to 95% by mass, and more preferably from 0.5% by mass to 90% by mass.

The softening point of the glass powder is preferably in the range of from 200° C. to 1000° C., and more preferably from 300° C. to 900° C., from the viewpoint of diffusivity during the diffusion treatment, and dripping.

The shape of the glass powder includes a substantially spherical shape, a flat shape, a block shape, a plate shape, a scale-like shape, and the like. From the viewpoint of coating property and uniform dispersion property, it is preferably a spherical shape, a flat shape, or a plate shape.

The particle diameter of the glass powder is preferably 50 μm or less. When a glass powder having a particle diameter of 50 μm or less is used, a smooth coated film can be easily obtained. Further, the particle diameter of the glass powder is more preferably 10 μm or less. The lower limit of the particle diameter is not particularly limited, and preferably 0.01 μm or more.

The particle diameter of the glass powder means the average particle diameter, and may be measured by laser diffraction particle size analyzer.

The acceptor element-containing glass powder is prepared according to the following procedure.

First, raw materials are weighed and filled in a crucible. The crucible may be made of platinum, platinum-rhodium, iridium, alumina, quartz, carbon, or the like, which is appropriately selected taking into consideration the melting temperature, atmosphere, reactivity with melted materials, and the like.

Next, the raw materials are heated to a temperature corresponding to the glass composition in an electric furnace, thereby preparing a solution. At this time, stirring is preferably applied such that the solution becomes homogenous.

Subsequently, the solution is allowed to flow on a zirconia or carbon plate or the like to result in vitrification of the solution.

Finally, the glass is pulverized into a powder. The pulverization can be carried out by using a known method such as jet mill, bead mill or ball mill.

The content of the acceptor element-containing glass powder in the composition for forming a p-type diffusion layer is determined taking into consideration coatability, diffusivity of acceptor elements, and the like. Generally, the content of the glass powder in the composition for forming a p-type diffusion layer is preferably from 0.1% by mass to 95% by mass, more preferably from 1% by mass to 90% by mass, still more preferably from 1.5% by mass to 85% by mass, and furthermore preferably from 2% by mass to 80% by mass.

Hereinafter, a dispersion medium will be described.

The dispersion medium is a medium which disperses the glass powder in the composition. Specifically, a binder, a solvent or the like is employed as the dispersion medium.

For example, the binder may be appropriately selected from a, polyvinyl alcohol, polyacrylamides, polyvinyl amides, polyvinyl pyrrolidone, polyethylene oxides, polysulfonic acid, acrylamide alkyl sulfonic acid, cellulose derivatives such as cellulose ethers, carboxymethylcellulose, hydroxyethylcellulose, ethylcellulose, gelatin, starch and starch derivatives, sodium alginates, xanthane, guar and guar derivatives, scleroglucan, tragacanth or dextrin derivatives, (meth)acrylic acid resins, (meth)acrylic acid ester resins (for example, alkyl (meth)acrylate resins, dimethlaminoethyl (meth)acrylate resins, or the like), butadiene resins, styrene resins, copolymers thereof, siloxane resins and the like. These compounds may be used individually or in a combination of two or more thereof.

The molecular weight of the binder is not particularly limited and is preferably appropriately adjusted taking into consideration a desired viscosity of the composition.

Examples of the solvent include ketone solvents such as acetone, methylethylketone, methyl-n-propylketone, methyl-iso-propylketone, methyl-n-butylketone, methyl-iso-butylketone, methyl-n-pentylketone, methyl-n-hexylketone, diethylketone, dipropylketone, di-iso-butylketone, trimethylnonanone, cyclohexanone, cyclopentanone, methylcyclohexanone, 2,4-pentanedione, acetonylacetone, γ-butyrolactone, and γ-valerolactone; ether solvents such as diethyl ether, methyl ethyl ether, methyl-n-propyl ether, di-iso-propyl ether, tetrahydrofuran, methyl tetrahydrofuran, dioxane, dimethyl dioxane, ethylene glycol dimethyl ether, ethylene glycol diethyl ether, ethylene glycol di-n-propyl ether, ethylene glycol dibutyl ether, diethylene glycol dimethyl ether, diethylene glycol diethyl ether, diethylene glycol methyl ethyl ether, diethylene glycol methyl-n-propyl ether, diethylene glycol methyl-n-butyl ether, diethylene glycol di-n-propyl ether, diethylene glycol di-n-butyl ether, diethylene glycol methyl-n-hexyl ether, triethylene glycol dimethyl ether, triethylene glycol diethyl ether, triethylene glycol methyl ethyl ether, triethylene glycol methyl-n-butyl ether, triethylene glycol di-n-butyl ether, triethylene glycol methyl-n-hexyl ether, tetraethylene glycol dimethyl ether, tetraethylene glycol diethyl ether, tetradiethylene glycol methyl ethyl ether, tetraethylene glycol methyl-n-butyl ether, diethylene glycol di-n-butyl ether, tetraethylene glycol methyl-n-hexyl ether, tetraethylene glycol di-n-butyl ether, propylene glycol dimethyl ether, propylene glycol diethyl ether, propylene glycol di-n-propyl ether, propylene glycol dibutyl ether, dipropylene glycol dimethyl ether, dipropylene glycol diethyl ether, dipropylene glycol methylethyl ether, dipropylene glycol methyl-n-butyl ether, dipropylene glycol di-n-propyl ether, dipropylene glycol di-n-butyl ether, dipropylene glycol methyl-n-hexyl ether, tripropylene glycol dimethyl ether, tripropylene glycol diethyl ether, tripropylene glycol methyl ethyl ether, tripropylene glycol methyl-n-butyl ether, tripropylene glycol di-n-butyl ether, tripropylene glycol methyl-n-hexyl ether, tetrapropylene glycol dimethyl ether, tetrapropylene glycol diethyl ether, tetradipropylene glycol methylethyl ether, tetrapropylene glycol methyl-n-butyl ether, dipropylene glycol di-n-butyl ether, tetrapropylene glycol methyl-n-hexyl ether, and tetrapropylene glycol di-n-butyl ether; ester solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methyl pentyl acetate, 2-ethyl butyl acetate, 2-ethyl hexyl acetate, 2-(2-butoxyethoxy)ethyl acetate, benzyl acetate, cyclohexyl acetate, methyl cyclohexyl acetate, nonyl acetate, methyl acetoacetate, ethyl acetoacetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, and di-n-butyl oxalate; ether acetate solvents such as ethylene glycol methyl ether propionate, ethylene glycol ethyl ether propionate, ethylene glycol methyl ether acetate, ethylene glycol ethyl ether acetate, diethylene glycol methyl ether acetate, diethylene glycol ethyl ether acetate, diethylene glycol-n-butyl ether acetate, propylene glycol methyl ether acetate, propylene glycol ethyl ether acetate, propylene glycol propyl ether acetate, dipropylene glycol methyl ether acetate, and dipropylene glycol ethyl ether acetate; aprotic solvents such as acetonitrile, N-methyl pyrrolidinone, N-ethyl pyrrolidinone, N-propyl pyrrolidinone, N-butyl pyrrolidinone, N-hexyl pyrrolidinone, N-cyclohexyl pyrrolidinone, N,N-dimethyl formamide, N,N-dimethyl acetamide, N,N-dimethyl sulfoxide; alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxy butanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethylnonyl alcohol, sec-tetradecyl alcohol, sec-heptadecyl alcohol, phenol, cyclohexanol, methylcyclohexanol, benzyl alcohol, ethylene glycol, 1,2-propylene glycol, 1,3-butylene glycol, diethylene glycol, dipropylene glycol, triethylene glycol, and tripropylene glycol; glycol monoether solvents such as ethylene glycol methyl ether, ethylene glycol ethyl ether, ethylene glycol monophenyl ether, diethylene glycol monomethyl ether, diethylene glycol monoethyl ether, diethylene glycol mono-n-butyl ether, diethylene glycol mono-n-hexyl ether, ethoxy triglycol, tetraethylene glycol mono-n-butyl ether, propylene glycol monomethyl ether, dipropylene glycol monomethyl ether, dipropylene glycol monoethyl ether, and tripropylene glycol monomethyl ether; ester solvents such as methyl lactate, ethyl lactate, n-butyl lactate, and n-amyl lactate; terpene solvents such as α-terpinene, α-terpinenol, myrcene, allo-ocimene, imonene, dipentene, α-dipentene, β-dipentene, terpinenol, carvone, ocimene and phellandrene; water, and the like. These materials may be used individually or in a combination of two or more thereof.

The composition and content of the dispersion medium in the composition for forming a p-type diffusion layer is determined taking into consideration coatability and acceptor concentration.

Hereinafter, the method for producing a p-type diffusion layer and a photovoltaic cell in accordance with the present invention will be described.

First, an alkaline solution is applied to silicon substrate which is a p-type semiconductor substrate, thereby removing the damaged layer, and a texture structure is obtained by etching.

Specifically, the damaged layer of the silicon surface, which is caused at the time of being sliced from an ingot, is removed by using 20% by mass of caustic soda. Then, a texture structure is formed by etching with a mixture of 1% by mass of caustic soda and 10% by mass of isopropyl alcohol. The photovoltaic cell achieves high efficiency through the formation of a texture structure on a light-receiving side (surface) to promote optical confinement effects.

Next, an n-type diffusion layer is uniformly formed by subjected to a treatment at a temperature of from 800 to 900° C. for several tens of minutes under a mixed gas atmosphere of phosphorus oxychloride ($POCl_3$), nitrogen and oxygen. At this time, according to the method using phosphorus oxychloride, since phosphorus is diffused bilaterally, the n-type diffusion layer is formed not only on the surface, but also on the side face and the rear surface.

For these reasons, there has been a need for a side etching process to remove the n-type diffusion layer of the side face.

Further, the composition for forming a p-type diffusion layer is applied on the n-type diffusion layer formed on the rear surface, i.e., non-light receiving surface. In the present invention, although there is no limit to the application method, for example, a printing method, a spinning method, brush application, a spray method, a doctor blade method, a roll coater method, an inkjet method or the like can be used.

The coating amount of the composition for forming a p-type diffusion layer is not particularly limited, and for example, may be from 0.01 $g/m^2$ to 100 $g/m^2$, and preferably from 0.1 $g/m^2$ to 10 $g/m^2$ as an amount of the glass powder.

Further, depending on the composition of the composition for forming a p-type diffusion layer, a drying process for volatilization of the solvent contained in the composition may be required after the application thereof, if necessary. In this case, the drying is carried out at a temperature of from 80 to 300° C., for 1 to 10 minutes when using a hot plate, or for 10 to 30 minutes when using a dryer or the like. Since these drying conditions are dependent on the solvent composition of the composition for forming a p-type diffusion layer, the present invention is not particularly limited to the above-stated conditions.

The semiconductor substrate, to which the composition for forming a p-type diffusion layer was applied, is subjected to a heat treatment at a temperature of from 600 to 1200° C. This heat treatment results in diffusion of an acceptor element into the semiconductor substrate, thereby forming an $p^+$-type diffusion layer. The heat treatment can be carried out using a known continuous furnace, batch furnace, or the like.

As a glass layer made of phosphoric acid glass or the like is formed on the surface of the $p^+$-type diffusion layer, the phosphoric acid glass is removed by etching. The etching can be carried out by using a known method, including a method of dipping a subject in an acid such as hydrofluoric acid, a method of dipping a subject in an alkali such as caustic soda, or the like.

In the conventional production method, an aluminum paste is applied to the rear surface and then sintered, thereby converting the n-type diffusion layer into the $p^+$-type diffusion layer and also forming an ohmic contact at the same time. However, since a aluminum paste has low conductivity, in order to reduce a sheet resistance, it is generally necessary to form a thick aluminum layer of about 10 to 20 µm after sintering on the entire rear surface. Furthermore, the coefficient of thermal expansion of aluminum is considerably different from the coefficient of thermal expansion of silicon, and therefore, such a difference results in generation of large internal stress in the silicon substrate during the sintering and cooling processes, which contributes to warpage of the silicon substrate.

The internal stress leads to the problem of damage to a crystal grain boundary resulting in an increase in power loss. The warpage makes a photovoltaic cell prone to damage during conveying of the cell in a module process or during connecting to a copper line which is referred to as a tub line. Recently, owing to improvement in slicing techniques, the thickness of the silicon substrate continues to be mode thinner, whereby the cell is more readily cracked.

However, according to the production method of the present invention, an n-type diffusion layer is converted into a $p^+$-type diffusion layer with a composition for forming a p-type diffusion layer, and then an electrode is made on the $p^+$-layer as another process. Accordingly, the material used for an electrode of the rear surface is not limited to aluminum. For example, Ag (silver), Cu (copper) or the like may also be used, so the thickness of the electrode of the rear surface can be further reduced as compared to the related art, and in addition, there is no need to form an electrode on the whole rear surface. As a result, it is possible to inhibit the generation of internal stress in the silicon substrate and warpage in sintering and cooling processes.

An antireflective film is formed over the n-type diffusion layer. The antireflective film is formed by using a known technique. For example, when the antireflective film is a silicon nitride film, the antireflective film is formed by a plasma CVD method using a mixed gas of $SiH_4$ and $NH_3$ as a raw material. In this case, hydrogen diffuses into crystals, and an orbit which does not contribute to bonding of silicon atoms, that is, a dangling bond binds to hydrogen, which inactivates a defect (hydrogen passivation).

More specifically, the antireflective film is formed under the conditions of a mixed gas $NH_3/SiH_4$ flow ratio of from 0.05 to 1.0, a reaction chamber pressure of from 0.1 to 2 Torr, a film-forming temperature of from 300 to 550° C., and a plasma discharge frequency of 100 kHz or higher.

A metal paste for a surface electrode is printed and applied on the antireflective film of the surface (light-receiving side) by a screen printing method, followed by drying to form a surface electrode. The metal paste for a surface electrode contains metal particles and glass particles as essential components, and optionally a resin binder, other additives, and the like.

Then, a rear surface electrode is also formed on $p^+$-type diffusion layer. As described hereinbefore, the constitutive material and forming method of the rear surface electrode are not particularly limited in the present invention. For example, the rear surface electrode may also be formed by applying the rear surface electrode paste containing a metal such as aluminum, silver or copper, followed by drying. In this case, a portion of the rear surface may also be provided with a silver paste for forming a silver electrode, for connection between cells in the module process.

Electrodes are sintered to complete a photovoltaic cell. When the sintering is carried out at a temperature of from 600 to 900° C. for several seconds to several minutes, the surface side undergoes melting of the antireflective film which is an insulating film, due to the glass particles contained in the electrode-forming metal paste, and the silicon surface is also partially melted, by which metal particles (for example, silver particles) in the paste form a contact with the silicon substrate, followed by solidification. In this manner, electrical conduction is made between the formed surface electrode and the silicon substrate. This type of process is called fire-through.

Hereinafter, the shape of the surface electrode is described. The surface electrode is made up of a bus bar electrode and a finger electrode intersecting the bus bar electrode.

The surface electrode can be formed, for example, by the above-stated screen printing of a metal paste, or plating of electrode materials, deposition of electrode materials by electron beam heating under high vacuum, or the like. The surface electrode made up of the bus bar electrode and the finger electrode is well known since it is typically used as an electrode of the light-receiving surface side, and a known method for the formation of the bus bar electrode and the finger electrode of the light-receiving surface side can be applied.

In the above methods for producing a p-type diffusion layer and a photovoltaic cell, in order to form an n-type diffusion layer on a silicon serving as a p-type semiconductor substrate, a mixed gas of phosphorus oxychloride ($POCl_3$), nitrogen and oxygen is used. However, a composition for forming an n-type diffusion layer may be used to form the n-type diffusion layer. The composition for forming an n-type diffusion layer contains an element of Group XV of the periodic table such as phosphorous (P), antimony (Sb) or the like as a donor element.

In the method using a composition for forming an n-type diffusion layer in order to form the n-type diffusion layer, first, the composition for forming an n-type diffusion layer is applied on a front surface of the p-type semiconductor substrate which is a light receiving surface, the composition for forming an p-type diffusion layer is applied on a rear surface, and then a thermal treatment is carried out at 600 to 1200° C. This thermal treatment results in diffusion of the donor element into the front surface of the p-type semiconductor substrate to form an n-type diffusion layer, and in diffusion of an acceptor element into the rear surface of the p-type semiconductor substrate to form a $p^+$-type diffusion layer. Aside from these processes, a photovoltaic cell is produced according to the same processes as in the method described above. The composition for forming an n-type diffusion layer referred to above preferably comprises a donor element-containing glass powder and a dispersion medium. The donor element is preferably selected from phosphorus (P) and/or antimony (Sb), and the description provided in this specification for the dispersion medium of the composition according to the present invention likewise applies to the dispersion medium of the above composition for forming an n-type diffusion layer.

The invention further includes the following embodiments.

(1) A paste composition for forming an p-type diffusion region in a semiconductor substrate, containing a dispersion of acceptor element-containing glass particles in a spreadable paste medium.

(2) The composition of (1), in which the glass particles contain a acceptor element selected from the group consisting of B (boron), aluminum (Al) and gallium (Ga).

(3) The composition of (1), in which the glass particles have a glass composition containing:

at least one acceptor element-containing material selected from $B_2O_3$, $Al_2O_3$ and $Ga_2O_3$; and at least one glass component material selected from $SiO_2$, $K_2O$, $Na_2O$, $Li_2O$, BaO, SrO, CaO, MgO, BeO, ZnO, PbO, CdO, $V_2O_5$, SnO, $ZrO_2$ and $MoO_3$.

(4) The composition of (3), in which the glass composition contains from about 0.1% to about 95%, by mass, of the glass-forming compound.

(5) The composition of (4), in which the glass composition contains from about 0.5% to about 90%, by mass, of the glass-forming compound.

(6) The composition of (3), in which the glass composition contains not more than about 50%, by mass, of $V_2O_5$.

(7) The composition of (6), in which the glass composition contains from about 1% to about 50%, by mass, of $V_2O_5$.

(8) The composition of (7), in which the glass composition contains from about 3% to about 40%, by mass, of $V_2O_5$.

(9) The composition of (3), in which the glass composition is substantially devoid of $V_2O_5$.

(10) The composition of (1), in which the glass particles have a softening temperature in a range from about 200° C. to about 1000° C.

(11) The composition of (1), in which the glass particles have a softening temperature in a range from about 300° C. to about 900° C.

(12) The composition of (1), in which the glass particles have a particle diameter not greater than about 100 micrometers.

(13) The composition of (1), in which the glass particles have a particle diameter not greater than about 50 micrometers.

(14) The composition of (1), in which spreadable paste medium comprises a binder and a solvent for the binder.

(15) The composition of (14), in which the binder comprises at least one natural or synthetic organic polymer.

(16) The composition of (14), in which the binder comprises ethylcellulose.

(17) The composition of (14), in which the solvent is a solvent volatile in a temperature range from about 80° C. to about 300° C.

(18) The composition of (1), in which the glass particles constitute from about 0.1%, by mass, to about 95%, by mass, of the paste composition.

(19) The composition of (1), in which the glass particles constitute from about 1%, by mass, to about 90%, by mass, of the paste composition.

(20) The composition of (1), further including particles of a metal capable of promoting crystallization of the glass.

(21) The composition of (20), in which the metal is selected from the group consisting of silver, silicon, copper, iron, zinc, and manganese.

(22) The composition of (20), in which the metal is selected from the group consisting of silver, silicon, and zinc.

(23) A method for forming an p-type diffusion region in a semiconductor, containing the steps of:

1) coating a portion of a semiconductor substrate with a layer of a composition containing a dispersion of acceptor element-containing glass particles in a dispersion medium, and 2) heating the coated semiconductor substrate to a temperature sufficient to cause acceptor element diffusion from the glass into the semiconductor substrate so as to form an p-type diffusion region in the semiconductor substrate.

(24) The method of (23), in which the layer of the composition is dried before step 2).

(25) The method of (24), in which the drying is conducted at a temperature in a range of about 80° C. to about 300° C.

(26) The method of (23), in which the heating in step 2) is conducted at a temperature in a range of about 600° C. to about 1200° C.

(27) The method of (23), in which the heating in step 2) is conducted for a period of time in a range from about one minute to about 60 minutes.

(28) The method of (27), in which the heating in step 2) is conducted for a period of time in a range from about 2 minutes to about 30 minutes.

(29) The method of (23), in which the semiconductor substrate is silicon.

(30) The method of (23), in which a glass layer formed on the surface of the semiconductor substrate in step 2) is subsequently removed.
(31) The method of (30), in which the glass layer formed on the surface of the semiconductor substrate in step 2) is removed by etching.
(32) The method of (23), in which the glass particles contain a acceptor element selected from the group consisting of B (boron), aluminum (Al) and gallium (Ga).
(33) The method of (23), in which the glass particles have a glass composition containing:
at least one acceptor element-containing material selected from $B_2O_3$, $Al_2O_3$ and $Ga_2O_3$; and
at least one glass component material selected from $SiO_2$, $K_2O$, $Na_2O$, $Li_2O$, BaO, SrO, CaO, MgO, BeO, ZnO, PbO, CdO, $V_2O_5$, SnO, $ZrO_2$ and $MoO_3$.
(34) The method of (33), in which the glass composition contains from about 0.1% to about 95%, by mass, of the glass-forming compound.
(35) The method of (34), in which the glass composition contains from about 0.5% to about 90%, by mass, of the glass-forming compound.
(36) The method of (33), in which the glass composition contains not more than about 50%, by mass, of $V_2O_5$.
(37) The method of (36), in which the glass composition contains from about 1% to about 50%, by mass, of $V_2O_5$.
(38) The method of (37), in which the glass composition contains from about 3% to about 40%, by mass, of $V_2O_5$.
(39) The method of (33), in which the glass composition is substantially devoid of $V_2O_5$.
(40) The method of (23), in which the glass particles have a softening temperature in a range from about 200° C. to about 1000° C.
(41) The method of (23), in which the glass particles have a softening temperature in a range from about 300° C. to about 900° C.
(42) The method of (23), in which the glass particles have a particle diameter not greater than about 100 micrometers.
(43) The method of (23), in which the glass particles have a particle diameter not greater than about 50 micrometers.
(44) The method of (23), in which the spreadable paste medium comprises a binder and a solvent for the binder.
(45) The method of (44), in which the binder comprises at least one natural or synthetic organic polymer.
(46) The method of (44), in which the binder comprises ethylcellulose.
(47) The method of (44), in which the solvent is a solvent volatile in a temperature range from about 80° C. to about 300° C.
(48) The method of (23), in which the glass particles constitute from about 0.1%, by mass, to about 95%, by mass, of the paste composition.
(49) The method of (23), in which the glass particles constitute from about 1%, by mass, to about 90%, by mass, of the paste composition.
(50) The method of (23), further containing particles of a metal capable of promoting crystallization of the glass.
(51) The method of (50), in which the metal is selected from the group consisting of silver, silicon, copper, iron, zinc, and manganese.
(52) The method of (50), in which the metal is selected from the group consisting of silver, silicon, and zinc.

EXAMPLES

Hereinafter, Examples in accordance with the present invention will be described in more detail, but the present invention is not limited thereto. Unless specifically indicated, the chemicals all used reagents. Unless specifically indicated, "%" refers to "% by mass".

Example 1

20 g of $B_2O_3$—$SiO_2$—$R_2O$ (R: Na, K, Li) based glass powder whose particle shape is substantially spherical, average particle diameter is 4.9 µm and softening point is 561° C. (trade name: TMX-404, manufactured by Tokan Material Technology Co., Ltd.), 0.5 g of ethylcellulose and 10 g of 2-(2-butoxyethoxy) ethyl acetate were mixed with an automatic mortar kneading machine and made into a paste to prepare a composition for forming a p-type diffusion layer.

The particle shape of the glass powder was judged by observation with a scanning electron microscope (trade name: TM-1000, manufactured by Hitachi High-Technologies Corporation). The average diameter of the glass powder was calculated with a laser diffraction particle size analyzer (measurement wave length: 632 mu, trade name: LS 13 320, manufactured by Beckman Coulter, Inc.). The softening point of the glass powder was measured according to a differential thermal analysis (DTA) curve with a Thermo Gravimetry Differential Thermal Analyzer (trade name: DTG-60H, manufactured by SHIMADZU CORPORATION).

Next, the prepared paste was applied to a p-type silicon substrate surface having an n-type layer formed thereon by screen printing, and dried on a hot plate at 150° C. for 5 minutes. Subsequently, a thermal diffusion treatment was carried out in an electric furnace at 1000° C. for 30 minutes. Then, in order to remove the glass layer, the substrate was dipped in hydrofluoric acid for 5 minutes, followed by washing with running water.

The surface at the side where the composition for forming a p-type diffusion layer was applied exhibited sheet resistance of 190 Ω/□ and the formation of a p-type diffusion layer through diffusion of B (boron).

The sheet resistance was measured by four probe method with a low resistance meter (trade name: Loresta-EP MCP-T360, manufactured by Mitsubishi Chemical Analytech Co., Ltd.).

Example 2

A p-type diffusion layer was formed in the same manner as in Example 1, except that the glass powder was changed to $B_2O_3$—$SiO_2$—RO (R: Mg, Ca, Sr, Ba) based glass powder whose particle shape is spherical, average particle diameter is 3.2 µm and softening point is 815° C. (trade name: TMX-603, manufactured by Tokan Material Technology Co., Ltd.). The surface at the side where the composition for forming a p-type diffusion layer was applied exhibited sheet resistance of 35 Ω/□ and the formation of a p-type diffusion layer through diffusion of B (boron).

Example 3

A p-type diffusion layer was formed in the same manner as in Example 1, except that the glass powder was changed to $B_2O_3$—$SiO_2$—RO (R: Mg, Ca, Sr, Ba) based glass powder whose particle shape is spherical, average particle diameter is 5.1 µm and softening point is 808° C. (trade name: TMX-403, manufactured by Tokan Material Technology Co., Ltd.). The surface at the side where the composition for forming a p-type diffusion layer was applied exhibited sheet resistance of 45 Ω/□ and the formation of a p-type diffusion layer through diffusion of B (boron).

Example 4

20 g of $P_2O_5$—$ZnO_2$—$R_2O$ (R: Na, K, Li) based glass powder whose particle shape is spherical, average particle diameter is 3.1 μm and softening point is 416° C. (trade name: TMX-203, manufactured by Tokan Material Technology Co., Ltd.), 0.3 g of ethylcellulose and 7 g of 2-(2-butoxyethoxy) ethyl acetate were mixed with an automatic mortar kneading machine and made into a paste to prepare a composition for forming an n-type diffusion layer. The prepared paste was applied to a p-type silicon substrate surface.

Subsequently, 20 g of $B_2O_3$—$SiO_2$—RO (R: Mg, Ca, Sr, Ba) based glass powder (trade name: TMX-603, manufactured by Tokan Material Technology Co., Ltd.), 0.5 g of ethylcellulose and 10 g of 2-(2-butoxyethoxy) ethyl acetate were mixed and made into a paste to prepare a composition for forming a p-type diffusion layer. The prepared paste was applied by screen printing to a p-type silicon substrate surface where a composition for forming an n-type diffusion layer was not printed, and dried on a hot plate at 150° C. for 5 minutes.

Next, a thermal diffusion treatment was carried out in an electric furnace at 1000° C. for 10 minutes. Then, in order to remove the glass layer, the substrate was dipped in hydrofluoric acid for 5 minutes, followed by washing with running water.

The surface at the side where the composition for forming an n-type diffusion layer was applied exhibited sheet resistance of 35 Ω/□ and the formation of an n-type diffusion layer through diffusion of P (phosphorus). The surface at the side where the composition for forming a p-type diffusion layer was applied exhibited sheet resistance of 47 Ω/□ and the formation of a p-type diffusion layer through diffusion of B (boron).

The foregoing description of the embodiments of the present invention has been provided for the purposes of illustration and description. It is not intended to be exhaustive or to limit the present invention to the precise forms disclosed. Obviously, many modifications and variations will be apparent to practitioners skilled in the art. The embodiments were chosen and described in order to best explain the principles of the present invention and its practical applications, thereby enabling others skilled in the art to understand the present invention for various embodiments and with the various modifications as are suited to the particular use contemplated. It is intended that the scope of the present invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed:
1. A method for producing a photovoltaic cell, including:
applying, on a semiconductor substrate, from 0.01 g/m² to 100 g/m² of a composition for forming a p-type diffusion layer, the composition comprising an acceptor element-containing glass powder and a dispersion medium; and
subjecting the substrate to a thermal diffusion treatment at a temperature of from 600° C. to 1000° C. to form a p-type diffusion layer,
wherein the acceptor element is included in the glass powder such that vaporization of the acceptor element is suppressed,
wherein the softening point of the acceptor element-containing glass powder is from 300° C. to 900° C.,
wherein the p-type diffusion layer has a sheet resistance of from 35Ω/□ to 190Ω/□, and
wherein the shape of the acceptor element-containing glass powder is selected from the group consisting of a substantially spherical shape, a flat shape, a block shape, a plane shape, and a scale-like shape.
2. The method for producing a photovoltaic cell according to claim 1, further including forming an electrode on the p-type diffusion layer.
3. The method for producing a photovoltaic cell according to claim 1, wherein the acceptor element comprises at least one selected from the group consisting of boron (B), aluminum (Al) and gallium (Ga).
4. The method for producing a photovoltaic cell according to claim 1, wherein the acceptor element-containing glass powder comprises an acceptor element-containing material and a glass component material.
5. The method for producing a photovoltaic cell according to claim 4, wherein the acceptor element-containing material comprises at least one selected from the group consisting of $B_2O_3$, $Al_2O_3$ and $Ga_2O_3$.
6. The method for producing a photovoltaic cell according to claim 4, wherein the glass component material comprises at least one selected from the group consisting of $SiO_2$, $K_2O$, $Na_2O$, $Li_2O$, BaO, SrO, CaO, MgO, BeO, ZnO, PbO, CdO, $V_2O_5$, SnO, $ZrO_2$, and $MoO_3$.
7. A method for producing a p-type diffusion layer, including:
applying, on a semiconductor substrate, from 0.01 g/m² to 100 g/m² of a composition for forming a p-type diffusion layer, the composition comprising an acceptor element-containing glass powder and a dispersion medium; and
conducting a thermal diffusion treatment at a temperature of from 600° C. to 1000° C.,
wherein the acceptor element is included in the glass powder such that vaporization of the acceptor element is suppressed,
wherein the softening point of the acceptor element-containing glass powder is from 300° C. to 900° C.,
wherein the p-type diffusion layer has a sheet resistance of from 35Ω/□ to 190Ω/□, and
wherein the shape of the acceptor element-containing glass powder is selected from the group consisting of a substantially spherical shape, a flat shape, a block shape, a plane shape, and a scale-like shape.
8. The method for producing a p-type diffusion layer according to claim 7, further including forming an electrode on the p-type diffusion layer.
9. The method for producing a p-type diffusion layer according to claim 7, wherein the acceptor element comprises at least one selected from the group consisting of boron (B), aluminum (Al) and gallium (Ga).
10. The method for producing a p-type diffusion layer according to claim 7, wherein the acceptor element-containing glass powder comprises an acceptor element-containing material and a glass component material.
11. The method for producing a p-type diffusion layer according to claim 10, wherein the acceptor element-con- taining material comprises at least one selected from the group consisting of $B_2O_3$, $Al_2O_3$ and $Ga_2O_3$.

12. The method for producing a p-type diffusion layer according to claim 10, wherein the glass component material comprises at least one selected from the group consisting of $SiO_2$, $K_2O$, $Na_2O$, $Li_2O$, BaO, SrO, CaO, MgO, BeO, ZnO, PbO, CdO, $V_2O_5$, SnO, $ZrO_2$ and $MoO_3$.

* * * * *